United States Patent
Malik

(10) Patent No.: US 6,573,701 B2
(45) Date of Patent: Jun. 3, 2003

(54) METHOD AND SYSTEM FOR LINE CURRENT DETECTION FOR POWER LINE CORDS

(75) Inventor: Randhir Singh Malik, Wake, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/838,798

(22) Filed: Apr. 20, 2001

(65) Prior Publication Data

US 2002/0153915 A1 Oct. 24, 2002

(51) Int. Cl.[7] .............................................. G01R 21/06
(52) U.S. Cl. .................... 324/127; 324/117 R
(58) Field of Search ...................... 324/117 R, 117 H, 324/126, 127, 142; 340/600

(56) References Cited

U.S. PATENT DOCUMENTS

| 4,806,854 A | 2/1989 | Mayer et al. |
|---|---|---|
| 5,646,535 A | 7/1997 | Dornier |
| 6,043,641 A | 3/2000 | Singer et al. |

*Primary Examiner*—Vinh P. Nguyen
(74) *Attorney, Agent, or Firm*—Sawyer Law Group

(57) ABSTRACT

Aspects for detecting current flow in a power line cord are described. In these aspects, a line current detector circuit is provided for each input plug line of a power distribution box. A determination of whether line current is flowing in a system line cord plugged into the power distribution box is based on a light indicator from the line detector circuit. The line current detector circuit includes a magnetic device for detecting line current flowing in a power line cord, and a light emitting diode (LED) coupled to the magnetic device for outputting a light indicative of whether current is flowing in the power line cord.

16 Claims, 3 Drawing Sheets

METHOD AND SYSTEM FOR LINE CURRENT DETECTION FOR POWER LINE CORDS

FIELD OF THE INVENTION

The present invention relates to power line cords, and more particularly to current flow detection in a power line cord.

BACKGROUND OF THE INVENTION

Power distribution boxes allow multiple power line cords from multiple devices to be plugged into a single piece of equipment in a convenient manner. With multiple power line cords plugged into a central location, a problem can arise when trying to unplug a line cord from the distribution box.

For example, sometimes there are a large number of line cords that are plugged in a distribution box. It is not possible to always determine when there are numerous cords and connections in locations away from the location of the distribution box if a line cord can be unplugged and new system plugged therein. Oftentimes, there is a need to determine if one of the line cords is being used to make room for another system to be powered.

At present, since there is not a definitive way to know whether a particular power line cord is currently carrying current, and there is no safe way of unplugging a line cord without the possibility of disrupting the operation of a device. Accordingly, a need exists for a technique that allows removal of a line cord from a distribution box in a safe and reliable manner. The present invention addresses such a need.

SUMMARY OF THE INVENTION

The present invention provides aspects detecting current flow in a power line cord. In these aspects, a line current detector circuit is provided for each input plug line of a power distribution box. A determination of whether line current is flowing in a system line cord plugged into the power distribution box is based on a light indicator from the line detector circuit. The line current detector circuit includes a magnetic device for detecting line current flowing in a power line cord, and a light emitting diode (LED) coupled to the magnetic device for outputting a light indicative of whether current is flowing in the power line cord.

Through a line current detection circuit, a system and method in accordance with the present invention prevents the disruption of machine operation normally caused by the unplugging of a line cord from a distribution box that is actively providing current to equipment. The aspects of the present invention provide an effective and efficient solution in a straightforward manner. These and other advantages of the aspects of the present invention will be more fully understood in the following detailed description in conjunction with the accompanying drawings.

DETAILED DESCRIPTION OF THE INVENTION

The present invention relates to line current detection for power line cords plugged into a power distribution box. The following description is presented to enable one of ordinary skill in the art to make and use the invention and is provided in the context of a patent application and its requirements. Thus, the present invention is not intended to be limited to the embodiment shown but is to be accorded the widest scope consistent with the principles and features described herein.

Figure 1:
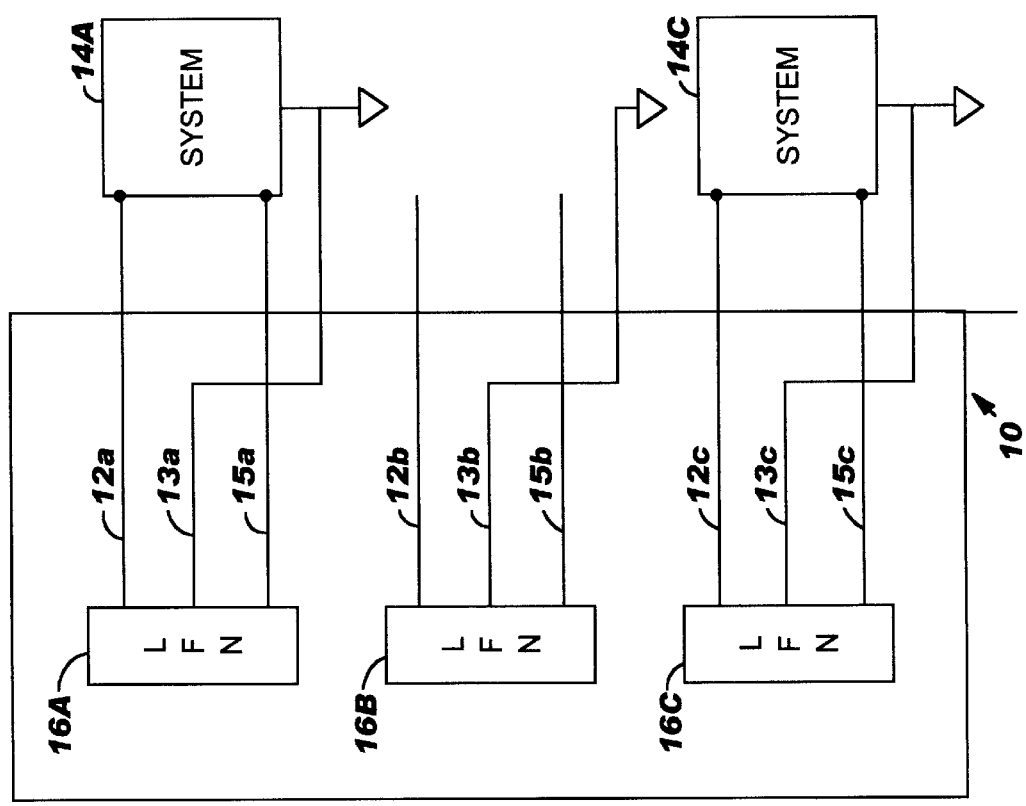
FIG. 1 illustrates a conventional power distribution box coupled to a plurality of systems.

FIG. 1 illustrates a conventional power distribution box 10 coupled to a plurality of systems 16. As is seen, the box 10 includes a plurality of line plug feeds 16A–16C. Each of the plug feeds 16A–16C are coupled to their respective line cords. The line cord coupled to line plug feed 16A comprises a line conductor 12a, frame conductor 13a, and neutral conductor 15a. The line cord coupled to line plug feed 16B comprises line conductor 12b, frame conductor 13b and neutral conductor 15b. The line cord coupled to line plug feed 16C comprises line conductor 12c, frame conductor 13c and neutral conductor 15c. As is seen, line plug feed 16B is unconnected to a system. For simplicity, only three systems are shown coupled to their respective plug feeds. One of ordinary skill in the art readily recognizes, however, that any number of line plug feed-system connections can be utilized and that would be within the spirit and scope of the present invention. In fact, a system and method in accordance with the present invention has significant utility when a large number of line cords are utilized, many of which may be connected to systems in remote locations.

In such a system 10 as before mentioned there may be a need to remove one line cord to make room for another to be powered. However, there is no safe way of unplugging a line cord without disrupting the operation of a device, if connected.

In accordance with the present invention, a magnetic device is utilized to detect the line current flowing in a line cord. The line current detector circuit keeps an LED (light emitting diode) blinking to indicate that a particular line cord is supplying current to a machine. In this manner, problems associated with unplugging a line that is actively providing current are avoided.

Figure 2:
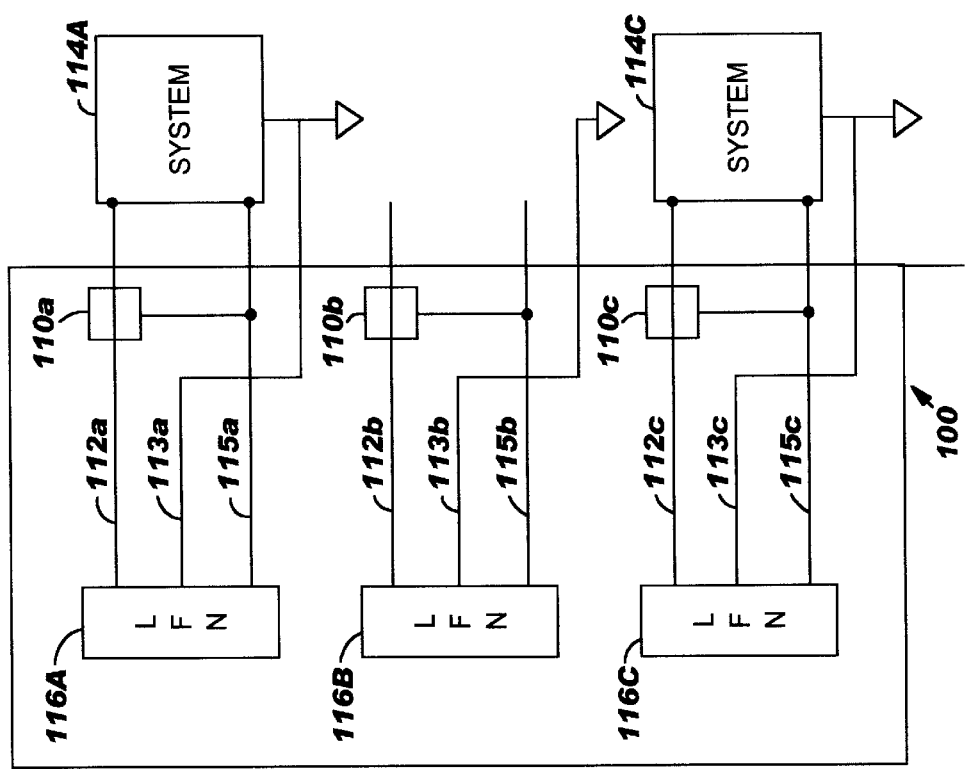
FIG. 2 illustrates a power distribution box coupled to a plurality of systems in accordance with the present invention.

FIG. 2 illustrates a power distribution box 100 coupled to a plurality of systems 114a–114c in accordance with the present invention. The distribution box 100 includes a plurality of line detector circuits 110a–110c. Each of the line detector circuits 110a–110c are coupled in series with its respective line conductor 112a–112c. As before mentioned, each line detector circuit 110a–110c us utilized to indicate if a line conductor 112a–112c supplying current.

Figure 3:
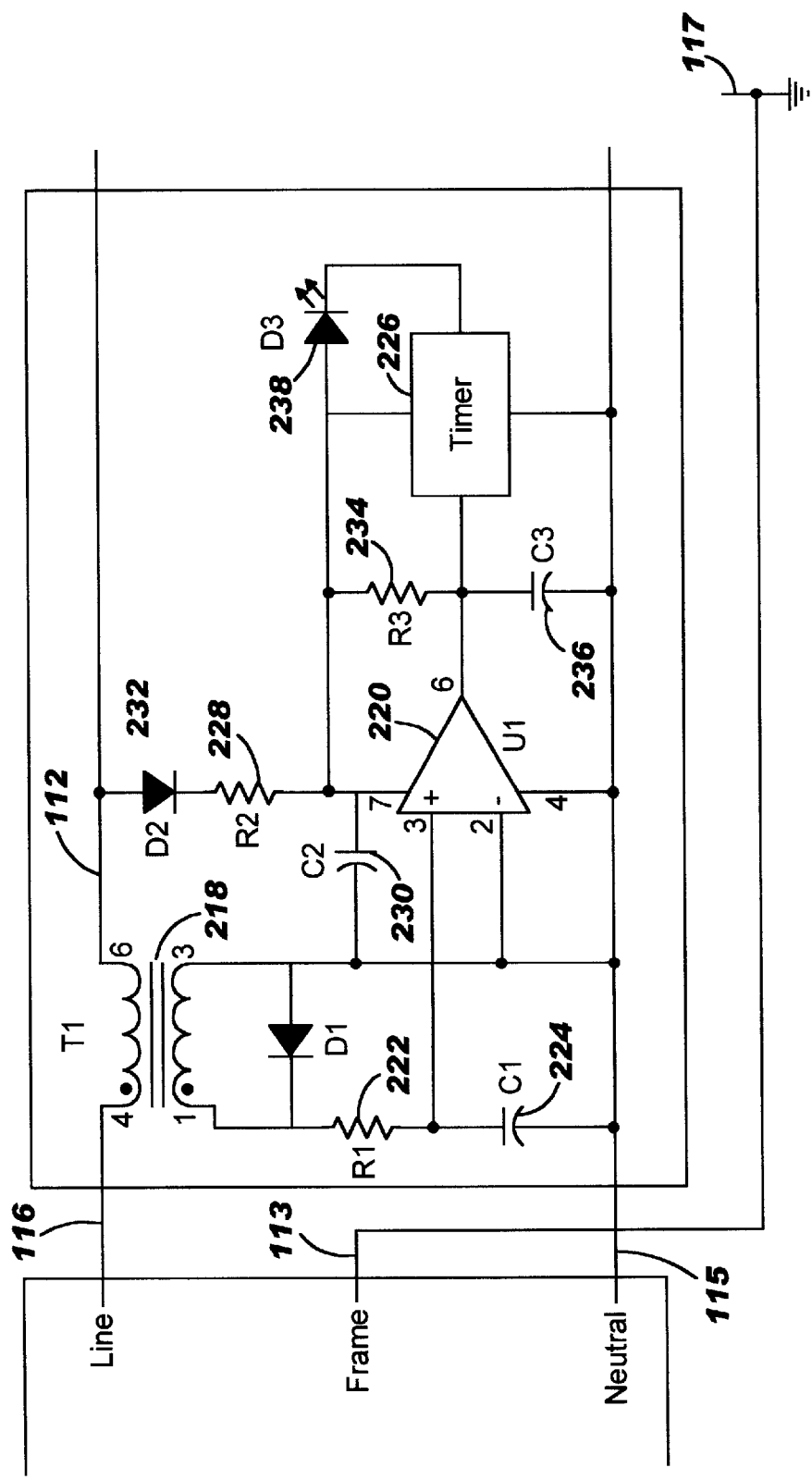
FIG. 3 is a preferred embodiment of a line detector circuit in accordance with the present invention.

To further describe the features of line detector circuit 110 refer now to the following discussion in conjunction with the accompanying figure. FIG. 3 is a preferred embodiment of a line detector circuit 100 in accordance with the present invention.

The circuit 110 includes a transformer 218 that develops a voltage across it primary winding when a current flows through it, with the voltage proportional to the current flowing through. The secondary winding of the transformer 218 is clamped to 0.5V (volts) to prevent a negative voltage from being applied to the input of a comparator 220. A resistor 222 and capacitor 224 are chosen with a time constant such that a DC voltage level is always present at the input of the comparator 220 when the line current is flowing, as is well understood by those skilled in the art.

Further included in the circuit 100 and coupled to the output of the comparator 220 is a timer 226. A resistor 228, a capacitor 230, and a diode 232 provide a DC bias for the comparator 220 and timer 226, and resistor 234 and a capacitor 236 determine a rate of blinking in an LED 238, as is standardly understood. The timer 226 is timed so that the LED 238 is blinking when the line current is flowing and the output of the comparator 220 is at a HIGH logic level. When there is no AC current flowing through the line conductor 112, the output of comparator 220 is at a LOW logic level. Thus, the timer 226 output will be at a HIGH logic level, and the LED 238 will not blink. Using the LED provides a straightforward indication of the status of current flow in the line cord. Thus, the lack of blinking in an LED associated with a particular line cord/plug, i.e., line cord 112b of FIG. 2, provides an indication that it is safe to remove that line cord from the plug, because it is not powering any equipment. In this manner, a machine is not inadvertently unplugged while the line cord is still actively providing current.

Through a line current detection circuit, a system and method in accordance with the present invention prevents the disruption of machine operation normally caused by the unplugging of a line cord from a distribution box that is actively providing current to equipment. The aspects of the present invention provide an effective and efficient solution in a straightforward manner.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting current flow in a power distribution box, the method comprising:
   (a) providing a line current detector circuit for each input plug line of a power distribution box including providing a transformer within the line current detector circuit to develop a voltage across a wiring when a current from the line current flows through, coupling the transformer to a comparator, coupling the comparator to a timer, and coupling the timer to a light emitting diode (LED), wherein the comparator provides a signal to the timer based on the voltage sensed by the transformer and the timer controls whether the LED appears to be blinking based on the signal provided by the comparator; and
   (b) determining whether line current is flowing in each input plug line based on the LED from the line detector circuit.

2. The method of claim 1 wherein the determining step (b) further comprises the step of (b1), identifying whether the LED is blinking.

3. The method of claim 2 wherein when the LED is blinking, the line current is flowing in the input plug line.

4. The method of claim 3 wherein when the LED is not blinking, the line current is not flowing in the input plug line.

5. A system for detecting line current flow in a power line cord, the system comprising:
   a plurality of plug feeds for a power distribution box;
   a plurality of systems plugged into the plurality of plug feeds via separate line cords; and
   a plurality of line detector circuits coupled between the plurality of systems and the plurality of plug feeds, each line detector circuit for indicating whether current is flowing in each of the separate line cords, wherein each of the plurality of line detector circuits further comprises a transformer to develop a voltage across a wiring when a current from a line current flows through and wherein the transformer is coupled to a comparator, the comparator is coupled to a timer, and the timer is coupled to a light emitting diode (LED) within each of the plurality of line detector circuits.

6. The system of claim 5 wherein each of the plurality of line detector circuits indicates whether current is flowing in the separate line cords by the LED.

7. The system of claim 6 wherein a blinking LED indicates that current is flowing in the separate line cord.

8. The system of claim 5 wherein the comparator provides a signal to the timer based on the voltage sensed by the transformer and the timer controls whether the LED appears to be blinking based on the signal provided by the comparator.

9. A line current detector circuit comprising:
   a transformer for detecting line current flowing in a power line cord;
   a light emitting diode (LED) coupled to the transformer;
   a comparator coupled to the transformer; and
   a timer coupled to the comparator and to the LED, wherein the LED outputs a light indicative of whether current is flowing in the power line cord.

10. The system of claim 9 wherein the comparator provides a signal to the timer based on the voltage sensed by the transformer, and the timer controls whether the LED appears to be blinking based on the signal provided by the comparator.

11. The system of claim 10 wherein a blinking LED indicates that current is flowing in the power line cord.

12. A power distribution box comprising:
   a plurality of plug feeds;
   a plurality of input plug lines, each of the input plug lines coupled to one of the plurality of plug feeds; and
   a plurality of line detector circuits, each of the plurality of line detectors coupled in series with one of the plurality of input plug lines, each of the plurality of line detector circuits for indicating whether current is flowing in each of the input plug lines, and wherein each of the plurality of line detector circuits further comprises a transformer to develop a voltage across a wiring when a current from a line current flows through, wherein the transformer is coupled to a comparator, the comparator is coupled to a timer, and the timer is coupled to a light emitting diode (LED) within each of the plurality of line detector circuits.

13. The power distribution box of claim 12 wherein each of the plurality of line detector circuits indicates whether current is flowing in the input plug lines by the LED.

14. The power distribution box of claim 13 wherein a blinking in the LED indicates that current is flowing in the input plug line.

15. The power distribution box of claim 12 wherein the comparator provides a signal to the timer based on the voltage sensed by the transformer and the timer controls whether the LED appears to be blinking based on the signal provided by the comparator.

16. A power distribution box comprising:
   a plurality of plug feeds;
   a plurality of input plug lines, each of the input plug lines coupled to one of the plurality of plug feeds; and a plurality of line detector circuits, each of the plurality of line detectors coupled in series with one of the plurality of input plug lines, each of the plurality of line detector circuits for indicating whether current is flowing in each of the input plug lines, wherein each of the plurality of line detector circuits indicates whether current is flowing in each of the line cords by a light indicator, wherein a blinking light indicator indicates that current is flowing in the line cord, wherein each of the plurality of line detector circuits further comprises a transformer to develop a voltage across a wiring when a current from a line current flows through, wherein the transformer is coupled to a comparator, the comparator is coupled to a timer, and the timer is coupled to a light emitting diode (LED), the LED providing the light indicator within each of the plurality of line detector circuits, wherein the comparator provides a signal to the timer based on the voltage sensed by the transformer and the timer controls whether the LED appears to be blinking based on the signal provided by the comparator.

* * * * *